(12) United States Patent
Keska et al.

(10) Patent No.: US 6,517,258 B1
(45) Date of Patent: Feb. 11, 2003

(54) PLASTIC PACKAGED OPTOELECTRONIC DEVICE

(75) Inventors: Joseph P. Keska, Pittston Township, Luzerne County, PA (US); Steven L. Moyer, Spring Township, Berks County, PA (US); Mary J. Nadeau, Bethlehem, PA (US); Steven P. O'Neill, Allentown, PA (US); John William Osenbach, Kutztown, PA (US); Duane S. Stackhouse, Lower Milford Township, Lehigh County, PA (US); Katherine Anne Yanushefski, Hereford, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/344,657

(22) Filed: Jun. 25, 1999

(51) Int. Cl.[7] .............................. G02B 6/36; G02B 6/42
(52) U.S. Cl. ............................. 385/92; 385/89; 385/93; 385/94
(58) Field of Search ............................. 385/88, 89, 92, 385/93, 94

(56) References Cited

U.S. PATENT DOCUMENTS

| 5,307,435 | A | * | 4/1994 | Chihara | 385/92 |
|---|---|---|---|---|---|
| 5,467,419 | A | * | 11/1995 | Roff et al. | 385/92 |
| 5,482,658 | A | | 1/1996 | Lebby et al. | 264/1.24 |
| 5,590,232 | A | * | 12/1996 | Wentworth et al. | 385/92 |
| 5,625,734 | A | * | 4/1997 | Thomas et al. | 385/88 |
| 5,692,084 | A | * | 11/1997 | Roff | 385/88 |
| 5,768,456 | A | | 6/1998 | Knapp et al. | 385/49 |
| 5,784,513 | A | | 7/1998 | Kuribayashi et al. | 385/88 |
| 5,790,733 | A | * | 8/1998 | Smith et al. | 385/88 |
| 5,857,050 | A | * | 1/1999 | Jiang et al. | 385/92 |
| 6,164,837 | A | * | 12/2000 | Haake et al. | 385/90 |
| 6,206,582 | B1 | * | 3/2001 | Gilliland | 385/92 |
| 6,243,508 | B1 | * | 6/2001 | Jewell et al. | 385/14 |
| 6,283,644 | B1 | * | 9/2001 | Gilliland et al. | 385/93 |

FOREIGN PATENT DOCUMENTS

| EP | 0 709 699 A2 | 10/1995 | G02B/6/42 |
|---|---|---|---|
| EP | 0 982 610 A2 | 7/1999 | G02B/6/42 |

OTHER PUBLICATIONS

European Search Report, Oct 27, 2000.*

* cited by examiner

Primary Examiner—John D. Lee
Assistant Examiner—Jennifer Doan

(57) ABSTRACT

The invention is an optoelectronic device including a semiconductor photodetector enclosed within a plastic housing. The housing includes a wall with an aperture therein for receiving optical signals. The photodetector is mounted to a flexible film which is, in turn, mounted to the housing so that the photodetector is aligned with the aperture. The device may further include a receptacle mounted to the wall for receiving an optical fiber aligned with the aperture and the photodetector.

20 Claims, 2 Drawing Sheets

PLASTIC PACKAGED OPTOELECTRONIC DEVICE

FIELD OF THE INVENTION

This invention relates to optoelectronics, and in particular to packaged optoelectronic receiver devices.

BACKGROUND OF THE INVENTION

In the field of optoelectronics, receivers are employed to convert an incoming optical signal to an electrical signal. The receiver typically includes a photodetector, such as a PIN photodiode, (and other electrical devices such as IC's, capacitors and resistors) which is packaged, either alone or in combination with a transmitter, so as to be aligned with an optical fiber. The package is usually metal and/or ceramic, and the fiber is laser welded to the package. While adequate, such packages tend to be expensive, and the laser welding of the fiber is usually time consuming.

It is, therefore, desirable to provide a low cost package with high speed active alignment between the photodetector and the optical fiber.

SUMMARY OF THE INVENTION

The invention is an optoelectronic device including a semiconductor photodetector enclosed within a plastic housing. The housing includes a wall with an aperture therein for receiving optical signals. The photodetector is mounted to a flexible film which is, in turn, attached to the housing so that the photodetector is aligned with the aperture. The device may further include a receptacle mounted to the wall for receiving an optical fiber aligned with the aperture and the photodetector. The receptacle is preferably mounted by means of an epoxy.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
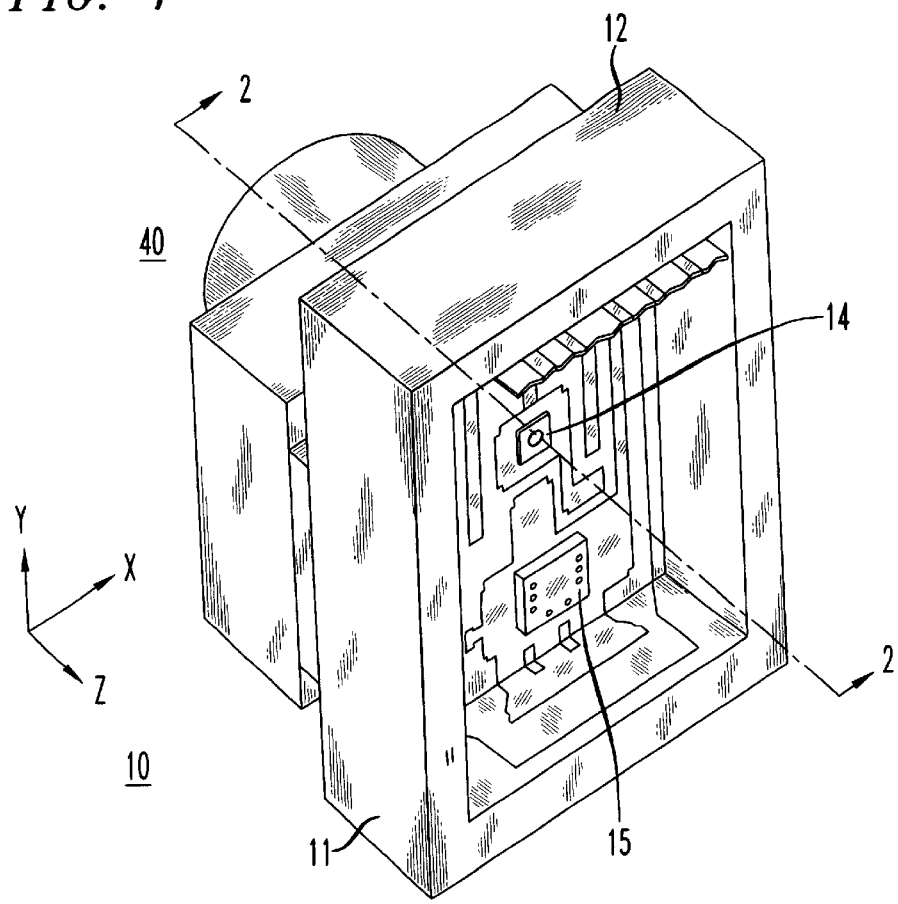
FIG. 1 is a perspective view of an optoelectronic device in accordance with an embodiment of the invention.
Figure 2:
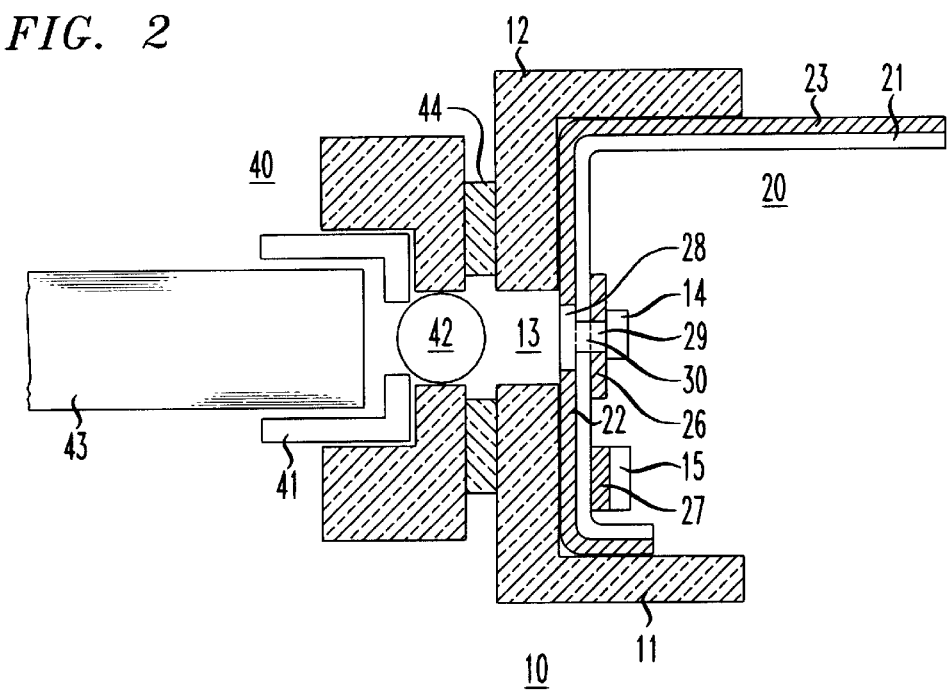
FIG. 2 is a cross sectional view along line 2—2 of FIG. 1.

FIGS. 1 and 2 illustrate a typical optoelectronic device, 10, employing the principles of the invention in accordance with one embodiment. A molded plastic housing, 11, is provided with a wall, 12, including a circular aperture, 13 of FIG. 2, formed therethrough. The housing, 11, is typically made of PPS (Polyphenylene Sulfide) or other suitable thermally stable plastic which is considerably less expensive than metal and ceramic housings.

Figure 3:
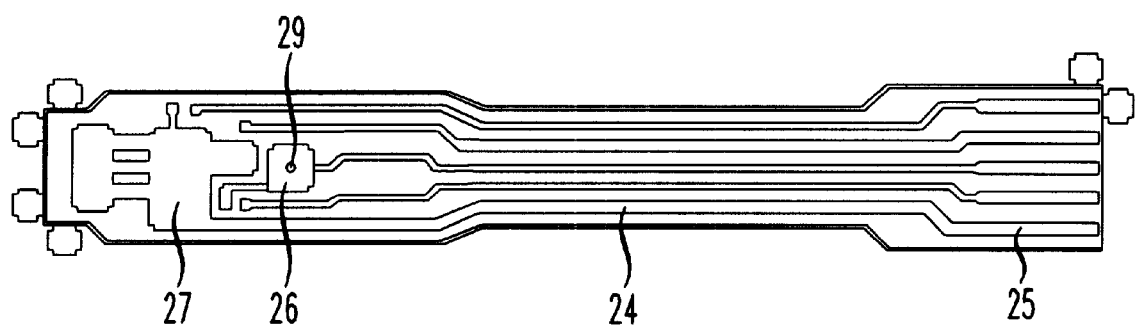
FIG. 3 is a plan view of an element of the device illustrated in FIGS. 1 and 2.
Figure 4:
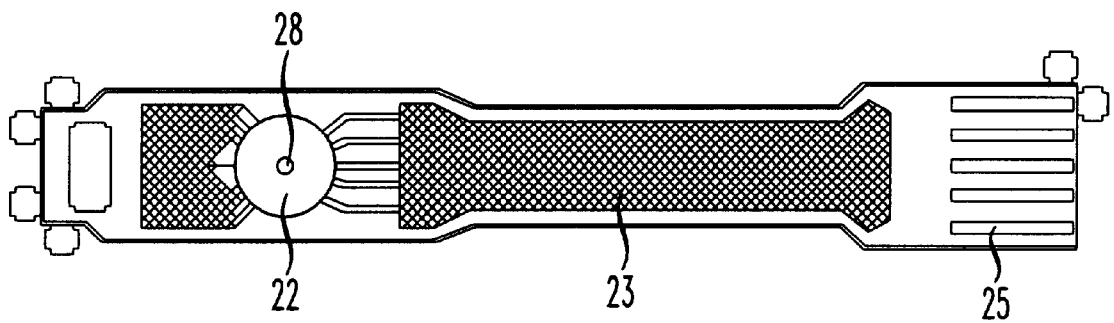
FIG. 4 is a plan view of the opposite surface of the element of FIG. 3.

A flexible thin film circuit, 20, is molded into the housing 11, by standard 3D injection molding techniques. The flexible circuit includes a flexible material, 21, which is usually polyimide, with metal deposits formed on both major surfaces. FIGS. 3 and 4 illustrate typical metal patterns formed on the opposite major surfaces of the flexible material. For example, one surface (FIG. 4) shows a metal pad, 22, electrically connected to a ground pad, 23, and the other surface (FIG. 3) illustrates a plurality of conductive leads, e.g., 24, extending from bond pads, 26 or 27, on one end to bond pads, e.g., 25, on the other end of the flexible circuit. These leads and bond pads are typically made of gold. The pads, 22 and 26, each include an aperture therethrough, 28 and 29, respectively, which are aligned with an aperture, 30, in the flexible film, 21. The apertures are designed to permit incoming light to pass therethrough.

Returning to FIGS. 1 and 2, a standard PIN photodiode, 14, is mounted on the conductive pad, 26, of FIG. 3, on the flexible film, 21, and an integrated circuit chip, 15, is mounted on the other conductive pad, 27 of FIG. 3, on the flexible film. The integrated circuit chip includes circuitry for driving the PIN photodiode, 14. The flexible circuit, 20, is molded in the housing so that the apertures, 28, 29, and 30, are aligned with the aperture, 13, in the wall, 12.

A plastic receptacle, 40, which may also be made of PPS, is provided with a cylindrical ferrule, 41, press fit or molded therein, on one end. The ferrule accommodates an optical fiber, 43, which is typically held in place by a standard optical connector (not shown). The receptacle can further include a lens, 42, aligned with the fiber, 43. The fiber is aligned with the PIN photodiode, 14, by placing the receptacle in contact with the wall, 12, at the area of the aperture, 13, propagating light through the fiber and measuring the intensity of the signal generated by the photodiode. The receptacle, 40, is moved around in the X-Y plane until a desired intensity is achieved. At that point, the receptacle is fixed on the wall by means of an epoxy, 44.

It will be appreciated that, since the housing, 11, and the receptacle, 40, are plastic, the package is less expensive than typical metal or ceramic housings. Further, the receptacle can provide quick alignment of the optical fiber, 43, and can be fixed in position without the need for time consuming laser welding.

The mounting of the PIN photodiode, 14, as part of the flexible circuit, 20, has additional advantages. The presence of the ground pad, 23, provides electromagnetic shielding for the PIN photodiode. Also, the pad, 22, which is also grounded, provides a condensation shield for the photodiode. That is, since the pad is grounded, it will be at a lower temperature than its surroundings during temperature excursions. Thus, condensation will collect at the shield, 22, rather than on the photodiode.

While the invention has been described with the use of a PIN photodiode, it will be appreciated that any standard photodetector can be packaged according to the present invention Further, the flexible circuit can include additional components thereon, such as capacitors, resistors, and integrated circuits in addition to the IC, 15, illustrated.

What is claimed is:

1. An optoelectronic device comprising:
   a housing including a wall, the wall having an aperture therethrough;
   a flexible film having an aperture therethrough;
   a bond pad located on the flexible film and having an aperture therethrough, the aperture of the bond pad and the flexible film being aligned with the aperture in the wall; and
   a photodetector mounted to the flexible film and aligned with the aperture in the bond pad.

2. The device according to claim 1 further comprising a receptacle adapted for receiving an optical fiber, the receptacle being mounted to the wall.

3. The device according to claim 2 further comprising an optical fiber mounted within the receptacle.

4. The device according to claim 2 wherein the receptacle is mounted to the wall by epoxy bonding.

5. The device according to claim 2 wherein the receptacle includes a ferrule coupled thereto.

6. The device according to claim 2 wherein the receptacle includes a lens aligned with the aperture in the wall.

7. The device according to claim 1 wherein the housing comprises polyphenylene sulfide.

8. The device according to claim 1 wherein the flexible film includes a conductive pad electrically coupled to ground potential, the conductive pad having an aperture therethrough aligned with the aperture in the bond pad.

9. The device according to claim 8 wherein the flexible film includes two surfaces with an aperture therethrough, the photodetector is mounted on one surface to receive light through the aperture in the film, and the conductive pad is formed on the opposite surface with another aperture therethrough aligned with the aperture in the film such that condensation in the device tends to collect on the pad rather than the photodetector.

10. The device according to claim 8 further comprising an additional conductive pad coupled to ground potential such as to provide electromagnetic interference protection for the photodetector.

11. The device according to claim 1 further comprising an integrated circuit chip mounted to the flexible film.

12. The device according to claim 1 wherein the flexible film is mounted to the housing by injection molding.

13. The device according to claim 1 wherein the flexible film is molded into the housing.

14. The device according to claim 1 wherein the wall includes two opposing surfaces through which the aperture in the wall passes.

15. The device according to claim 14 wherein the two opposing surfaces are substantially parallel.

16. The device according to claim 1 wherein the flexible film includes at least one conductive trace located thereon and electrically contacting the photodetector.

17. The device according to claim 1 wherein the bond pad comprises gold.

18. The device according to claim 1 wherein the aperture in the wall is larger than and substantially concentric with the aperture in the flexible film.

19. The device according to claim 1 wherein the housing includes at least three walls to which the flexible film is attached.

20. The device according to claim 1 wherein the flexible film comprises polyimide.

* * * * *